United States Patent
Cobley

(10) Patent No.: US 10,268,613 B2
(45) Date of Patent: Apr. 23, 2019

(54) REDUNDANT CONTROL SYSTEM DEVOID OF PROGRAMMABLE DEVICES

(71) Applicant: Lockheed Martin Corporation, Bethesda, MD (US)

(72) Inventor: Richard A. Cobley, Scranton, PA (US)

(73) Assignee: Lockheed Martin Corporation, Bethesda, MD (US)

(*) Notice: Subject to any disclaimer, the term of this patent is extended or adjusted under 35 U.S.C. 154(b) by 130 days.

(21) Appl. No.: 15/050,599

(22) Filed: Feb. 23, 2016

(65) Prior Publication Data

US 2017/0242812 A1 Aug. 24, 2017

(51) Int. Cl.
| | |
|---|---|
| G06F 11/00 | (2006.01) |
| G06F 13/36 | (2006.01) |
| G01R 31/317 | (2006.01) |
| G01R 31/3177 | (2006.01) |
| G06F 13/40 | (2006.01) |

(52) U.S. Cl.
CPC ......... *G06F 13/36* (2013.01); *G01R 31/3177* (2013.01); *G01R 31/31703* (2013.01); *G06F 13/4068* (2013.01)

(58) Field of Classification Search
CPC ............. G06F 11/0796; G06F 11/1608; G06F 11/1616; G06F 11/1641; G06F 11/2007; G06F 11/27; G06F 11/16; G06F 11/18; G01R 31/31703; G01R 31/3177
See application file for complete search history.

(56) References Cited

U.S. PATENT DOCUMENTS

| | | | | |
|---|---|---|---|---|
| 6,504,411 B2* | 1/2003 | Cartagena | ............ | H03K 3/0375 327/199 |
| 6,732,300 B1* | 5/2004 | Freydel | ................. | G06F 11/184 714/10 |
| 7,539,931 B2* | 5/2009 | Thayer | ................... | G11C 5/005 326/11 |
| 7,870,299 B1* | 1/2011 | Sorensen | ............ | G06F 11/1004 710/2 |
| 7,884,636 B2* | 2/2011 | Rezgui | ............. | H03K 19/00392 326/21 |
| 7,902,898 B2* | 3/2011 | Tseng | ..................... | H03K 3/355 327/266 |
| 7,928,771 B2* | 4/2011 | Yokoo | ....................... | H02P 8/12 318/256 |

(Continued)

FOREIGN PATENT DOCUMENTS

KR 10-20150110169 A 10/2015

OTHER PUBLICATIONS

International Search Report and Written Opinion for International Patent Application No. PCT/US2017/018737, dated Jun. 1, 2017, 13 pages.

*Primary Examiner* — Elmira Mehrmanesh
(74) *Attorney, Agent, or Firm* — Withrow & Terranova, PLLC

(57) ABSTRACT

A control system is disclosed. The control system includes an input module (IM) configured to be detachably coupled to a connection plane, an output module (OM) configured to be detachably coupled to the connection plane, and a logic module (LM) configured to be detachably coupled to the connection plane. The IM, OM, and LM are devoid of any programmable devices in any electronic path from any input port to any output port of the IM, OM, and LM.

19 Claims, 7 Drawing Sheets

(56) References Cited

U.S. PATENT DOCUMENTS

| | | | |
|---|---|---|---|
| 7,958,394 B1* | 6/2011 | Bridgford | G06F 11/187 |
| | | | 714/11 |
| 7,965,098 B2* | 6/2011 | Wood | H03K 19/23 |
| | | | 326/11 |
| 8,117,512 B2* | 2/2012 | Sorensen | A61B 7/00 |
| | | | 714/30 |
| 8,489,919 B2* | 7/2013 | Clark | G06F 9/3867 |
| | | | 714/10 |
| 2007/0067092 A1 | 3/2007 | Burkatovsky | |
| 2011/0311013 A1 | 12/2011 | Cobley et al. | |
| 2012/0124255 A1 | 5/2012 | DiBartolomeo et al. | |
| 2012/0272109 A1* | 10/2012 | Satterfield | G06F 11/267 |
| | | | 714/724 |
| 2013/0009664 A1* | 1/2013 | Golke | H03K 19/00338 |
| | | | 326/11 |
| 2013/0086444 A1* | 4/2013 | Liu | G06F 11/08 |
| | | | 714/752 |
| 2015/0318857 A1 | 11/2015 | Halberstadt | |

* cited by examiner

REDUNDANT CONTROL SYSTEM DEVOID OF PROGRAMMABLE DEVICES

TECHNICAL FIELD

The embodiments relate generally to control systems and, in particular, to redundant control systems that are devoid of programmable devices.

BACKGROUND

Control systems often utilize programmable devices, such as microprocessor-based programmable logic controllers (PLCs) that execute software instructions, and the like. Certain industries, such as the nuclear power industry, have become increasingly concerned with risks associated with programmable systems.

A programmable device is often a single point of failure in a control system. If the microprocessor operates incorrectly, either due to a microprocessor fault, or a software bug, the entire control system can be negatively impacted. This is particularly problematic in certain environments, such as a nuclear power generation facility.

Consequently, regulations impose substantial requirements on a PLC-based control system, such as multiple channels and a diverse actuation system (DAS) for the reactor protection system (RPS) making such systems increasingly complex. Time and costs associated with getting Nuclear Regulatory Commission (NRC) design certification has increased substantially in recent years, particularly for programmable control systems. One result of this is that existing nuclear utilities are reluctant to change or replace their original designs with newer systems because of the inherent or perceived risks of software common cause failures and because of the resources required to process a license amendment request (LAR) and obtain NRC approval.

SUMMARY

The embodiments relate to a redundant control system that is devoid of any programmable devices. The embodiments eliminate software common cause failures, and provide redundancy across the entire control system. The embodiments comprise only analog and discrete electronic components and are devoid of any programmable devices, avoiding regulations relating to programmable devices in certain industries, eliminating risks associated with program updates, and reducing chances of cyber security issues.

In one embodiment, a control system devoid of programmable devices is provided. The control system includes a connection plane configured to receive a plurality of logic modules, a plurality of input modules, and a plurality of output modules. The control system also includes an input module (IM) configured to be detachably coupled to the connection plane. The IM includes an IM input port, an IM output port, and an input circuit. The input circuit is configured to receive an input signal from a device via the IM input port, generate an IM output signal from the input signal, and transmit the IM output signal via the IM output port. No programmable devices are in any electronic path from the IM input port to the IM output port.

The control system also includes a logic module (LM) configured to be detachably coupled to the connection plane. The LM includes an LM input port configured to receive the IM output signal, an LM output port, and a logic circuit. The logic circuit is configured to receive an input logic circuit signal based on the IM output signal, generate an LM output signal in response to the input logic circuit signal, and transmit the LM output signal via the LM output port. No programmable devices are in any electronic path from the LM input port to the LM output port.

The control system also includes an output module (OM) configured to be detachably coupled to the connection plane. The OM includes an OM input port configured to receive the LM output signal, an output control circuit, and a switch circuit. The output control circuit is configured to receive an input circuit signal based on the LM output signal, generate an OM drive signal in response to the input circuit signal, and send the OM drive signal to the switch circuit. No programmable devices are in any electronic path from the OM input port to the switch circuit.

In another embodiment, a triple redundant control system is provided. The control system includes a connection plane configured to receive a plurality of logic modules, a plurality of input modules and a plurality of output modules. The control system includes an IM configured to be detachably coupled to the connection plane. The IM includes an IM input port, three IM output ports, and three input circuits. Each input circuit is configured to receive an input signal from a device via the IM input port, generate an IM output signal of three IM output signals from the input signal, and transmit the IM output signal via one IM output port of the three IM output ports.

The control system also includes an LM configured to be detachably coupled to the connection plane. The LM includes three LM input ports, each LM input port configured to receive one of the three IM output signals, three LM output ports, and three logic circuits. Each logic circuit is configured to receive an input logic circuit signal that is based on one or more IM output signals of the three IM output signals, generate an LM output signal of three LM output signals in response to the input logic circuit signal, and transmit the LM output signal via one LM output port of the three LM output ports.

The control system also includes an OM configured to be detachably coupled to the connection plane. The OM includes three OM input ports, each OM input port configured to receive one of the three LM output signals, a switch circuit, and three output control circuits. Each output control circuit is configured to receive an input circuit signal based on one or more LM output signals of the three LM output signals, generate an OM drive signal of three OM drive signals in response to the input circuit signal, and send the OM drive signal to the switch circuit.

In another embodiment, a triple redundant control system devoid of programmable devices is provided. The control system includes a connection plane configured to receive a plurality of logic modules, a plurality of input modules and a plurality of output modules. The control system includes an IM configured to be detachably coupled to the connection plane. The IM includes an IM input port, three IM output ports, and three input circuits. Each input circuit is configured to receive an input signal from a device via the IM input port, generate an IM output signal of three IM output signals from the input signal, and transmit the IM output signal via one IM output port of the three IM output ports. No programmable devices are in any electronic path from the IM input port to any IM output port of the three IM output ports.

The control system also includes an LM configured to be detachably coupled to the connection plane. The LM comprises three LM input ports, each LM input port configured to receive one of the three IM output signals, three LM output ports, and three logic circuits. Each logic circuit is configured to receive an input logic circuit signal based on one or more IM output signals of the three IM output signals, generate an LM output signal of three LM output signals in response to the input logic circuit signal, and transmit the LM output signal via one LM output port of the three LM output ports. No programmable devices are in any electronic path from any LM input port to any LM output port.

The control system also includes an OM configured to be detachably coupled to the connection plane. The OM comprises three OM input ports, each OM input port configured to receive one of the three LM output signals, a switch circuit, and three output control circuits. Each output control circuit is configured to receive an input circuit signal based on one or more LM output signals of the three LM output signals, generate an OM drive signal of three OM drive signals in response to the input circuit signal, and send the OM drive signal to the switch circuit. No programmable devices are in any electronic path from any OM input port to the switch circuit.

In another embodiment, an LM for a control system is provided. The LM comprises a connector configured to connect the LM to a connection plane, an LM input port configured to receive an IM output signal from an IM connected to the connection plane, an LM output port, and a logic circuit. The logic circuit is configured to receive an input logic circuit signal based on the IM output signal, generate an LM output signal in response to the input logic circuit signal, and transmit the LM output signal via the LM output port to an output module connected to the connection plane. No programmable devices are in any electronic path from the LM input port to the LM output port.

Those skilled in the art will appreciate the scope of the disclosure and realize additional aspects thereof after reading the following detailed description of the embodiments in association with the accompanying drawing figures.

BRIEF DESCRIPTION OF THE DRAWINGS

The accompanying drawing figures incorporated in and forming a part of this specification illustrate several aspects of the disclosure and, together with the description, serve to explain the principles of the disclosure.

DETAILED DESCRIPTION

The embodiments set forth below represent the information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The use herein of ordinals in conjunction with an element is solely for distinguishing what might otherwise be similar or identical labels, such as "first LM BIT circuit" and "second LM BIT circuit," and does not imply a priority, a type, an importance, or other attribute, unless otherwise stated herein.

As used herein and in the claims, the articles "a" and "an" in reference to an element refers to "one or more" of the element unless otherwise explicitly specified.

The embodiments relate to a redundant control system that is devoid of any programmable devices. The embodiments eliminate software common cause failures, and provide redundancy across the entire control system. The embodiments comprise only analog and discrete electronic components and are devoid of any programmable devices, avoiding regulations relating to programmable devices in certain industries, eliminating risks associated with program updates, and reducing chances of cyber security issues.

Figure 1:
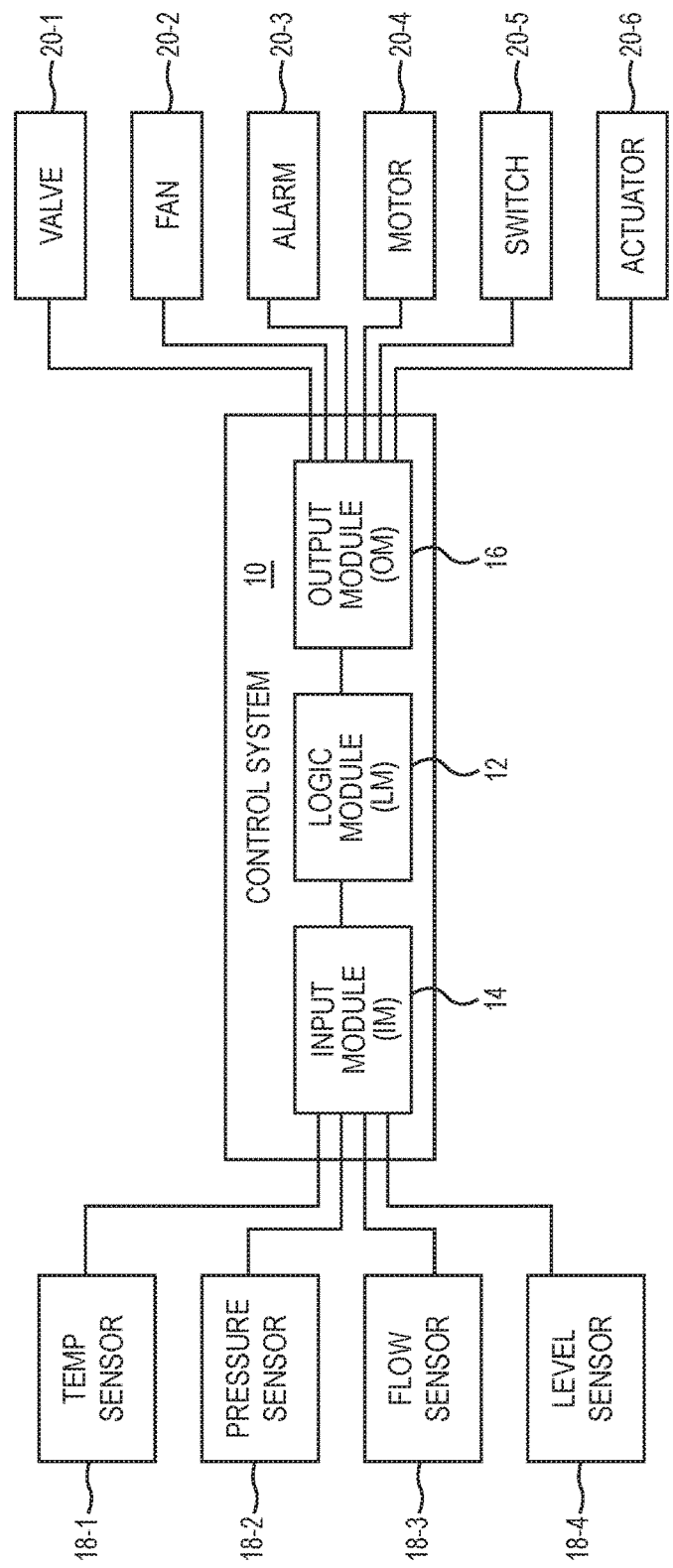
FIG. 1 is a block diagram illustrating a control system according to one embodiment.

FIG. 1 is a block diagram illustrating a control system 10 according to one embodiment. The control system 10 is hot swappable and redundant and comprises a connection plane configured to receive a plurality of detachable logic modules (LMs) 12, a plurality of detachable input modules (IMs) 14, and a plurality of detachable output modules (OMs) 16. The connection plane comprises physical interfaces that match corresponding physical interfaces on the LMs 12, the IMs 14, and the OMs 16, such that signals can be communicated to and from each of the LMs 12, the IMs 14, and the OMs 16 via the connection plane.

In some embodiments, the control system 10 has at least triple redundancy features as described in greater detail herein. In some embodiments, the control system 10 is devoid of any programmable devices in any electronic path from an input port to an output port. In some embodiments, the control system 10 has at least triple redundancy features and is devoid of any programmable devices in any electronic path from an input port to an output port.

As used herein the phrase "programmable device" means a component or circuit whose functionality can be changed without physically altering the physical communication lines between electronic components. Programmable devices include, but are not limited to, microprocessors, systems on chips, programmable logic devices, digital signal processing devices, microcontroller-based devices, and field programmable gate arrays.

The phrase "discrete circuit" means an electronic circuit that comprises discrete electronic components only, such as one or more of resistors, capacitors, diodes, transistors, inductors, comparators, amplifiers, threshold detectors, shift registers, boolean logic gates, and the like, and whose functionality is based on the physical connections between such electronic components and not on programmable logic or software.

The IM 14 is communicatively coupled to and receives input signals from one or more devices 18-1, 18-2, 18-3, and 18-4 (generally devices 18). The devices 18 may comprise any device, including sensor devices, that provide data that is useful or appropriate for a control system. By way of non-limiting example, the device 18-1 comprises a temperature sensor that generates sensor data relating to a temperature of a sensed item. The device 18-2 comprises a pressure sensor that generates sensor data relating to a pressure of the sensed item. The device 18-3 comprises a flow sensor that generates sensor data relating to a flow rate of a sensed fluid. The device 18-4 comprises a level sensor that generates sensor data relating to a level of the sensed fluid.

The IM 14 receives the input signals from the devices 18 via one or more IM input ports. The IM 14 may process the input signals, such as sampling the input signals to convert the input signals from an analog form to a digital form, filtering the input signals to remove noise, and the like. The IM 14 generates an IM output signal and transmits the IM output signal via an IM output port to the LM 12. In some embodiments, all electronic circuits in the electronic path from the IM input ports to the IM output port are discrete circuits, and no programmable devices are in the electronic path from the IM input ports to the IM output port.

The LM 12 receives the IM output signal via one or more LM input ports. The LM generates an input logic circuit signal based on the IM output signal. The LM 12 generates an LM output signal response to the input logic circuit signal. For example, the LM 12 may determine that a temperature of the item sensed by the device 18-1 is too high or too low, that a pressure of the item sensed by the device 18-2 is too high or too low, that a flow of the fluid sensed by the device 18-3 is too slow or too fast, that a level of the fluid sensed by the device 18-4 is too high or too low, or any combination of the above. Based on such determination, the LM 12 generates the LM output signal and transmits the LM output signal to the OM 16 via an LM output port. In some embodiments, all electronic circuits in the electronic path from the LM input port to the LM output port are discrete circuits, and no programmable devices are in the electronic path from the LM input port to the LM output port.

The OM 16 receives the LM output signal via one or more OM input ports. The OM 16 generates an input circuit signal based on the LM output signal. The OM 16 generates an OM drive signal in response to the input circuit signal and sends the OM drive signal to a switch circuit. In some embodiments, all electronic circuits in the electronic path from the OM input port to the switch circuit are discrete circuits, and no programmable devices are in the electronic path from the OM input port to the switch circuit.

The switch circuit is directed to one or more devices 20-1-20-6 (generally, devices 20). The devices 20 may comprise any suitable device that may be useful or appropriate for a control system. By way of non-limiting example, the device 20-1 comprises a valve, and the OM drive signal alters the flow of a fluid through the valve. The device 20-2 comprises a fan, and the OM drive signal alters the air movement caused by the fan. The device 20-3 comprises an alarm, and the OM drive signal causes the alarm to operate. The device 20-4 comprises a motor, and the OM drive signal effects the operation of the motor. The device 20-5 comprises a switch, and the OM drive signal effects the operation of the switch. The device 20-6 comprises an actuator, and the OM drive signal effects the operation of the actuator.

Figure 2:
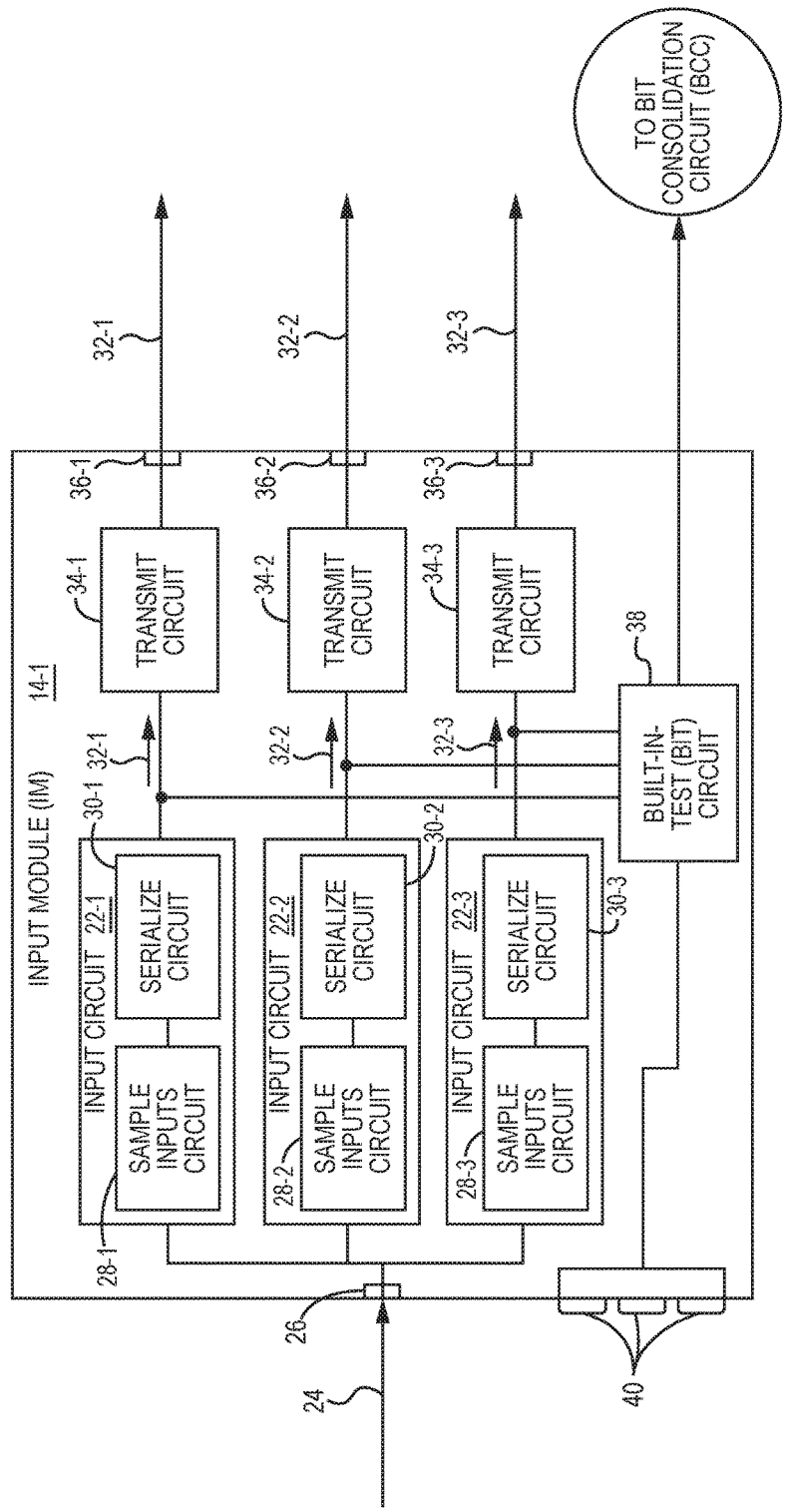
FIG. 2 is a block diagram illustrating an input module according to one embodiment.

FIG. 2 is a block diagram illustrating an IM 14-1 in greater detail according to one embodiment. The IM 14-1 includes three input circuits 22-1-22-3 (generally, "input circuits 22"). An input signal 24 is received by the IM 14-1 via an input port 26. The input signal 24 is provided to each of the three input circuits 22. While for purposes of illustration only a single input signal 24 is illustrated herein, the IM 14-1 may be receiving any number of input signals 24 from devices 18 concurrently. The input circuit 22-1 includes a sample inputs circuit 28-1 and a serialize circuit 30-1. The sample inputs circuit 28-1 samples the input signal 24 and generates a digital signal. The serialize circuit 30-1 serializes multiple input signals 24 so that multiple input signals 24 may be communicated over a single path. In one embodiment, the serialize circuit 30-1 serializes the multiple input signals 24 by time-division multiplexing the multiple input signals 24. Sample input circuits 28-2 and 28-3 serve the same function as the sample input circuit 28-1, and serialize circuits 30-2 and 30-3 serve the same function as the serialize circuit 30-1. The three input circuits 22-1-22-3 generate corresponding IM output signals 32-1-32-3 that in ideal circumstances should be identical to one another. Transmit circuits 34-1-34-3 transmit the IM output signals 32-1-32-3 via IM output ports 36-1-36-3. The IM 14-1 has three electronic paths from the input port 26 to the IM output ports 36. In one embodiment, no programmable devices are in any of the three electronic paths.

A built-in-test (BIT) circuit 38 receives the three IM output signals 32. The BIT circuit 38 determines whether any of the IM output signals 32 deviates from the other IM output signals 32, and thus contains faulty data. Such faulty data may be due, for example, to a faulty sample input circuit 28 or a faulty serialize circuit 30. The BIT circuit 38 may be coupled to a plurality of lights 40 that are perceivable by an operator. If the BIT circuit 38 determines that one of the IM output signals 32 contains faulty data, the BIT circuit 38 may send a signal to the lights 40 to alter a state of the lights 40. For example, each of the lights 40 may correspond to one of the input circuits 22, and the BIT circuit 38 may send a signal to activate the light 40 that corresponds to the input circuit 22 that generated the faulty data. This allows an operator to visibly determine that some circuitry in the IM 14-1 is faulty and identifies the particular input circuit 22.

The BIT circuit 38 may also be communicatively coupled to a BIT consolidation circuit on an LM 12 that receives signals from multiple BIT circuits 38 and performs actions based on such signals.

In this example, the IM 14-1 has triple redundancy, such that if any two of the IM output signals 32-1-32-3 are not generated, one IM output signal 32-1-32-3 will still be generated and provided to an LM 12. While for purposes of illustration the embodiments have primarily triple redundancy, the embodiments are not limited to triple redundancy and have applicability to any level of redundancy.

Figure 3:
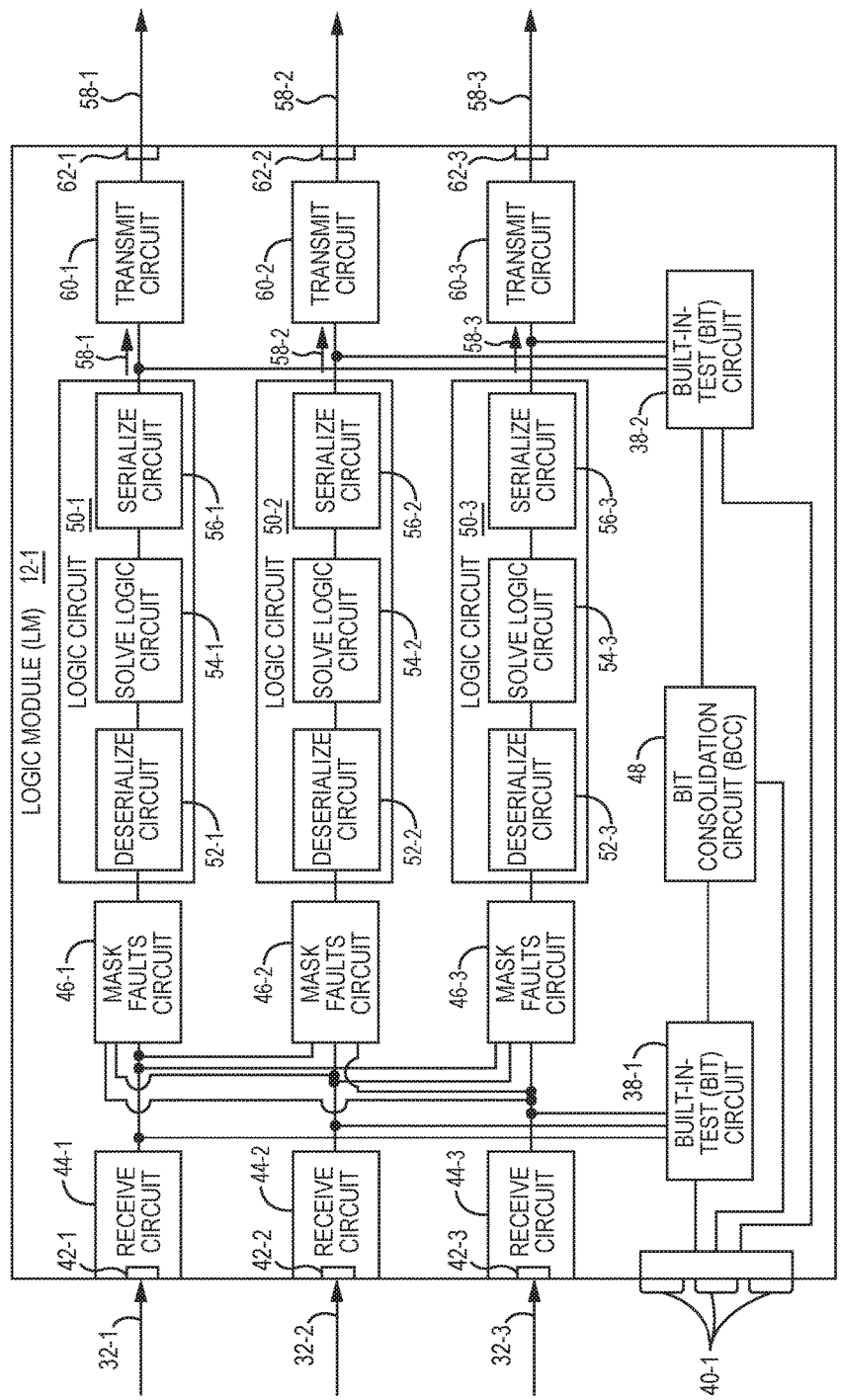
FIG. 3 is a block diagram illustrating a logic module according to one embodiment.

FIG. 3 is a block diagram illustrating an LM 12-1 in greater detail according to one embodiment. The LM 12-1 includes three LM input ports 42-1-42-3. Each LM input port 42-1-42-3 receives one of the three IM output signals 32-1-32-3. The LM 12-1 also includes three receive circuits 44-1-44-3 that process the received three IM output signals 32-1-32-3. The three receive circuits 44-1-44-3 provide the three IM output signals 32-1-32-3 to three corresponding mask faults circuits 46-1-46-3. A BIT circuit 38-1 receives the three IM output signals 32. The BIT circuit 38-1 determines whether any of the IM output signals 32 deviates from the other IM output signals 32, and thus contains faulty data. The BIT circuit 38-1 is coupled to one or more lights 40-1 and to a BIT consolidation circuit 48. The BIT consolidation circuit 48 receives signals from BIT circuits on the LM 12-1, the IM 14-1, and the OM 16. The BIT consolidation circuit 48, based on the signals, may send an alert or perform some other action to apprise an operator of a faulty module or circuit. The BIT consolidation circuit 48 may activate one or more lights 40-1 on the LM 12-1 based on the signals.

The mask faults circuit 46-1 receives each of the IM output signals 32-1-32-3. The mask faults circuit 46-1 operates as a "2-out-of-3" voting circuit and generates an input logic circuit signal based on a majority of the three IM output signals 32. For example, if a binary "1" is present in the IM output signals 32-1 and 32-2 and a binary "0" is present in the IM output signal 32-3, then the mask faults circuit 46-1 generates a binary "1". The mask faults circuits 46-2 and 46-3 operate identically to the mask faults circuit 46-1. Thus, the output of the mask faults circuit 46-1 is based on each of the IM output signals 32-1-32-3.

The LM 12-1 includes three logic circuits 50-1-50-3. Each logic circuit 50-1-50-3 receives an input logic circuit signal from a corresponding mask faults circuit 46-1-46-3 that is based on the three IM output signals 32-1-32-3 as discussed above with the regard to the mask faults circuits 46-1-46-3. The logic circuit 50-1 includes a deserialize circuit 52-1 that deserializes the input logic circuit signal received from the mask faults circuit 46-1. In particular, the deserialize circuit 52-1 demultiplexes the time-divisioned multiplex signals from the input logic circuit signal and generates parallel signals. The parallel signals are processed by a solve logic circuit 54-1. The solve logic circuit 54-1 implements the desired processing depending on the application. The solve logic circuit 54-1 contains no programmable devices and comprises only discrete circuits. Output signals of the solve logic circuit 54-1 are received by a serialize circuit 56-1, which again serializes the output signals for communication over a single communications path. Deserialize circuits 52-2 and 52-3 operate identically to the deserialize circuit 52-1. Solve logic circuits 54-2 and 54-3 operate identically to the solve logic circuit 54-1. Serialize circuits 56-2 and 56-3 operate identically to the serialize circuit 56-1.

The logic circuits 50-1-50-3 generate corresponding LM output signals 58-1-58-3. A BIT circuit 38-2 receives the three LM output signals 58-1-58-3. The BIT circuit 38-2 determines whether any of the LM output signals 58-1-58-3 deviates from the other LM output signals 58-1-58-3, and thus contains faulty data. The BIT circuit 38-2 is coupled to the BIT consolidation circuit 48 and to the one or more lights 40-1. Transmit circuits 60-1-60-3 transmit LM output signals 58-1-58-3 via LM output ports 62-1-62-3.

The LM 12-1 has a plurality of electronic paths from the LM input ports 42 to the LM output ports 62. In one embodiment, no programmable devices are in any of the plurality of electronic paths. All electronic circuits in the electronic paths from the LM input ports 42 to the LM output ports 62 are discrete circuits.

Figure 4:
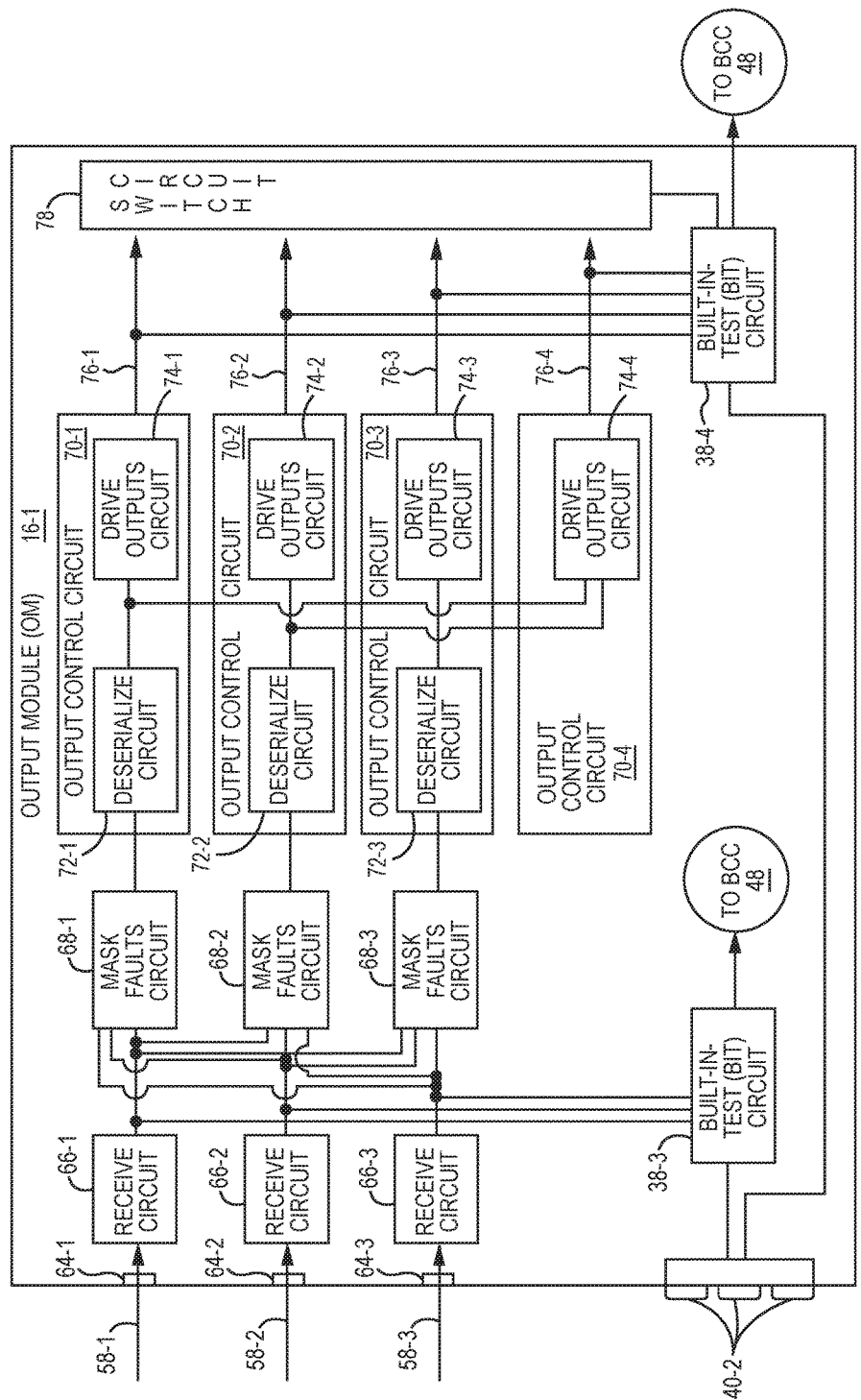
FIG. 4 is a block diagram illustrating an output module according to one embodiment.

FIG. 4 is a block diagram illustrating an OM 16-1 in greater detail according to one embodiment. The OM 16-1 includes three OM input ports 64-1-64-3. Each OM input port 64-1-64-3 receives one of the three LM output signals 58-1-58-3. The OM 16-1 also includes three receive circuits 66-1-66-3 that process the received three LM output signals 58-1-58-3. The three receive circuits 66-1-66-3 provide the three LM output signals 58-1-58-3 to three corresponding mask faults circuits 68-1-68-3. A BIT circuit 38-3 receives the three LM output signals 58-1-58-3. The BIT circuit 38-3 determines whether any of the LM output signals 58-1-58-3 deviates from the other LM output signals 58-1-58-3, and thus contains faulty data. The BIT circuit 38-3 is coupled to the BIT consolidation circuit 48, and may activate one or more lights 40-2 on the OM 16-1 to indicate a faulty circuit.

The mask faults circuit 68-1 receives each of the LM output signals 58-1-58-3 and operates in the same manner discussed above with regard to the mask faults circuit 46-1. The mask faults circuit 68-1 generates an input circuit signal based on a majority of the three LM output signals 58-1-58-3.

The OM 16-1 includes four output control circuits 70-1-70-4. Output control circuits 70-1-70-3 receive corresponding input circuit signals from corresponding mask faults circuits 68-1-68-3. The output control circuit 70-4 receives the input circuit signals from the mask faults circuits 68-1 and 68-2, and logically "ANDs" the two input circuit signals.

The output control circuit 70-1 includes a deserialize circuit 72-1 that deserializes the input circuit signal received from the mask faults circuit 68-1. In particular, the deserialize circuit 72-1 demultiplexes the time-divisioned multiplex signals from the input circuit signal and generates parallel signals. The parallel signals are processed by drive outputs circuit 74-1. The drive outputs circuit 74-1 generates a suitable drive signal 76-1 for the respective device 20 to which the drive signal 76-1 is destined. Deserialize circuits 72-2-72-3 operate identically to the deserialize circuit 72-1. Drive outputs circuits 74-2-74-3 operate identically to drive outputs circuit 74-1. The drive outputs circuit 74-4 receives signals from the deserialize circuits 72-1 and 72-2.

The output control circuits 70-1-70-4 generate corresponding drive signals 76-1-76-4 and send the drive signals 76-1-76-4 to a switch circuit 78. The switch circuit 78 will be illustrated in greater detail in FIG. 5. A BIT circuit 38-4 receives the drive signals 76-1-76-4. The BIT circuit 38-4 determines whether any of the drive signals 76-1-76-4 deviates from the other drive signals 76-1-76-4, and thus contains faulty data. The BIT circuit 38-4 is coupled to the BIT consolidation circuit 48 and to the one or more lights 40-2.

The OM 16-1 has a plurality of electronic paths from the OM input ports 64 to the switch circuit 78. In one embodiment, no programmable devices are in any of the plurality of electronic paths. All electronic circuits in the electronic paths from the OM input ports 64 to the switch circuit 78 are discrete circuits.

Figure 5:
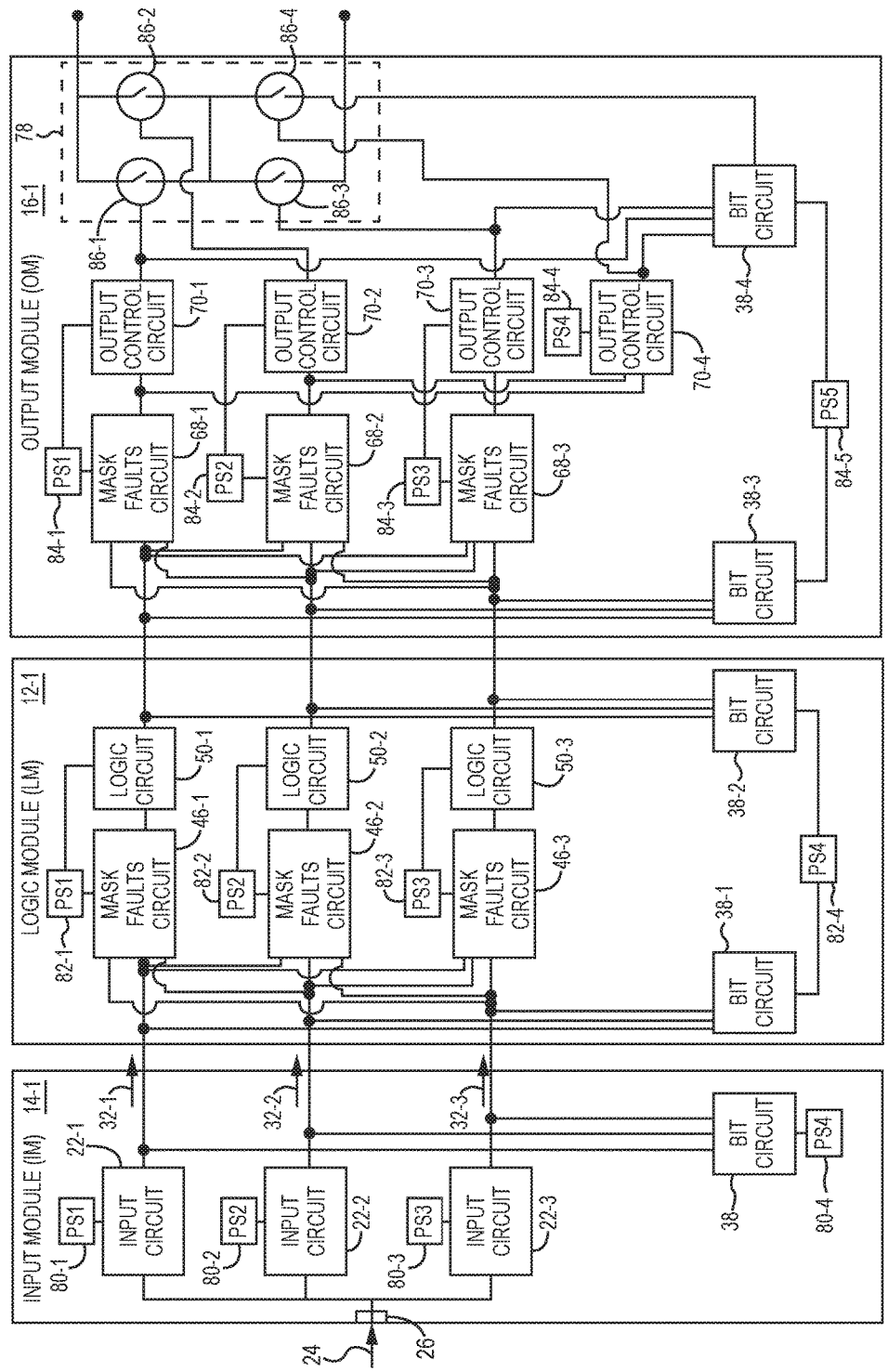
FIG. 5 is a block diagram illustrating simplified versions of the input module, the logic module, and the output module to illustrate signal flow through the input module, the logic module, and the output module according to one embodiment.

FIG. 5 is a block diagram illustrating simplified versions of the IM 14-1, the LM 12-1, and the OM 16-1 to illustrate signal flow through the IM 14-1, the LM 12-1, and the OM 16-1 according to one embodiment. In one embodiment, the various circuits are provided power by redundant power supplies (PSs). For example, PSs 80-1-80-3 provides power to the input circuits 22-1-22-3. Thus, if any of the PSs 80-1-80-3 fail, two other input circuits 22-1-22-3 will continue to operate. A PS 80-4 provides power to the BIT circuit 38.

A PS 82-1 supplies power to the mask faults circuit 46-1 and the logic circuit 50-1. A PS 82-2 supplies power to the mask faults circuit 46-2 and the logic circuit 50-2. A PS 82-3 supplies power to the mask faults circuit 46-3 and the logic circuit 50-3. A PS 82-4 provides power to the BIT circuits 38-1 and 38-2.

A PS 84-1 supplies power to the mask faults circuit 68-1 and the output control circuit 70-1. A PS 84-2 supplies power to the mask faults circuit 68-2 and the output control circuit 70-2. A PS 84-3 supplies power to the mask faults circuit 68-3 and the output control circuit 70-3. A PS 84-4 supplies power to the output control circuit 70-4. A PS 84-5 provides power to the BIT circuits 38-3 and 38-4.

In this example, the switch circuit 78 comprises four gates 86-1-86-4, each of the gates 86 being driven by a different output control circuit 70.

Figure 6:
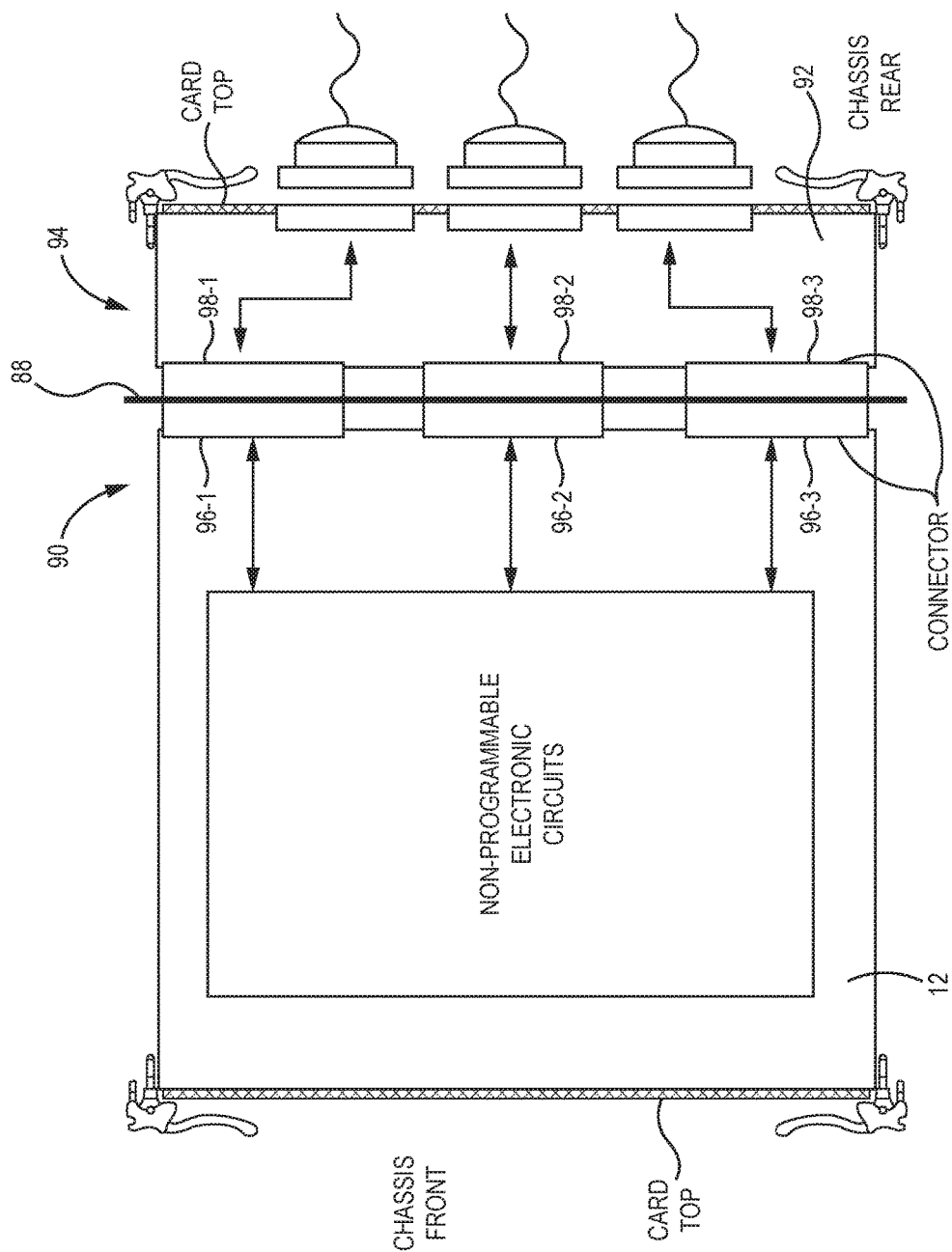
FIG. 6 is a block diagram illustrating a connection plane according to one embodiment.

FIG. 6 is a block diagram illustrating a connection plane 88 according to one embodiment. IMs 14, LMs 12, and OMs 16 detachably couple to the connection plane 88 from a front side 90. One or more rear transition modules (RTMs) 92 plug into the connection plane 88 from a back side 94. The LM 12 is illustrated as being detachably coupled to the connection plane 88 via a plurality of connectors 96-1-96-3. The connectors 96-1-96-3 provide a physical and electrical interface between the LM 12 and the connection plane 88. The RTM 92 is detachably coupled to the connection plane 88 via a plurality of connectors 98-1-98-3. The connectors 98-1-98-3 provide a physical and electrical interface between the RTM 92 and the connection plane 88. The RTM 92 interfaces field input and output signals from the devices 18 and devices 20 to the front-loaded modules by busing those signals from connectors on the RTM 92 through the corresponding connection plane 88 connector to the front-loaded IMs 14, LMs 12, and/or OMs 16.

Figure 7:
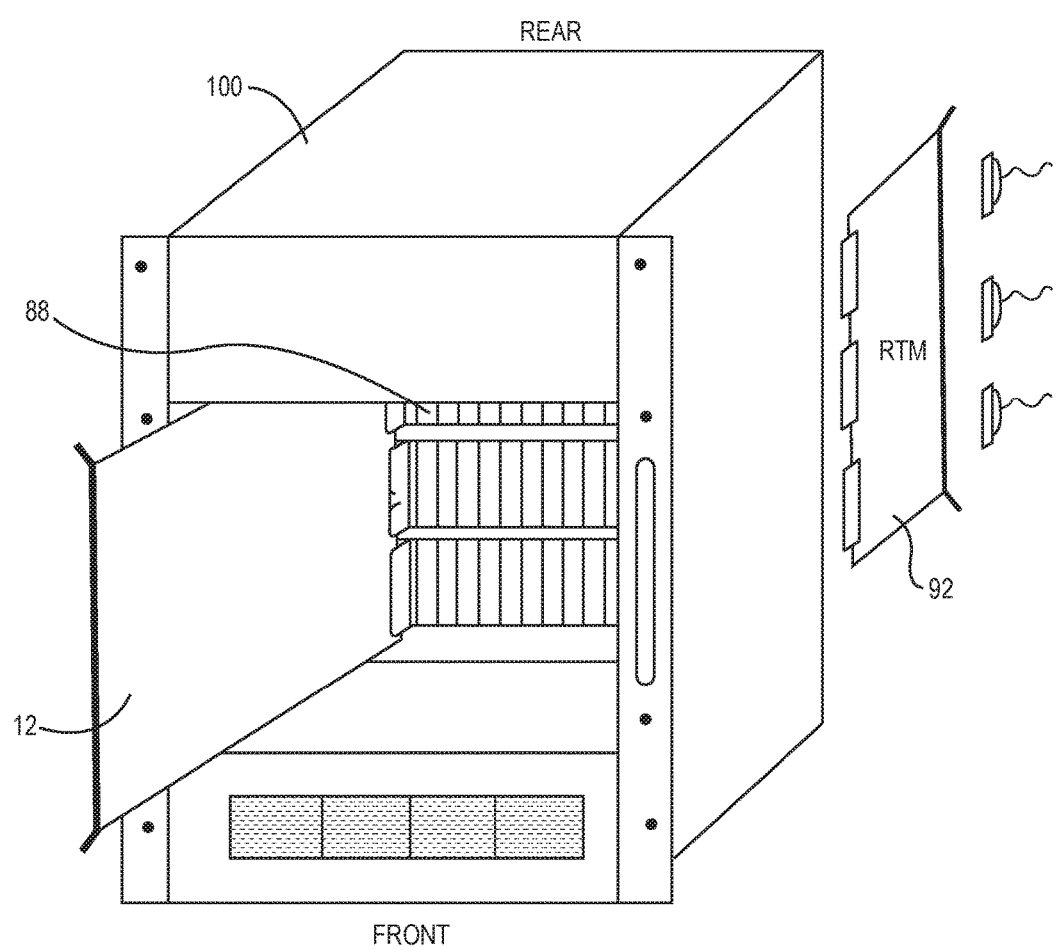
FIG. 7 is a diagram illustrating the control system according to another embodiment.

FIG. 7 is a diagram illustrating the control system 10 according to another embodiment. The control system 10 includes a chassis 100 and illustrates the LM 12 in a front-loaded orientation with the connector plane 88, and the RTM 92 in a rear-loaded orientation with the connector plane 88.

Those skilled in the art will recognize improvements and modifications to the preferred embodiments of the disclosure. All such improvements and modifications are considered within the scope of the concepts disclosed herein and the claims that follow.

What is claimed is:

1. A logic module (LM) for a control system, the LM comprising:
   a connector configured to connect the LM to a connection plane; and
   an LM input port configured to receive an input module (IM) output signal from an IM connected to the connection plane, an LM output port, and a logic circuit, the logic circuit configured to:
      receive an input logic circuit signal based on the IM output signal;
      generate an LM output signal in response to the input logic circuit signal; and
      transmit the LM output signal via the LM output port to an output module connected to the connection plane;
   wherein no programmable devices are in any electronic path from the LM input port to the LM output port;
   wherein the LM comprises three logic circuits, each logic circuit configured to:
      receive an input logic circuit signal based on one or more IM output signals of three IM output signals received from the IM;
      generate an LM output signal of three LM output signals in response to the input logic circuit signal; and
      transmit the LM output signal via one LM output port of the three LM output ports to the output module.

2. A control system comprising:
   a connection plane configured to receive a plurality of logic modules, a plurality of input modules, and a plurality of output modules;
   an input module (IM) configured to be detachably coupled to the connection plane, the IM comprising an IM input port, an IM output port, and an input circuit, the input circuit configured to:
      receive an input signal from a device via the input port;
      generate an IM output signal from the input signal; and
      transmit the IM output signal via the IM output port;
   wherein no programmable devices are in any electronic path from the IM input port to the IM output port;
   a logic module (LM) configured to be detachably coupled to the connection plane, the LM comprising an LM input port configured to receive the IM output signal, an LM output port, and a logic circuit, the logic circuit configured to:
      receive an input logic circuit signal based on the IM output signal;
      generate an LM output signal in response to the input logic circuit signal; and
      transmit the LM output signal via the LM output port;
   wherein no programmable devices are in any electronic path from the LM input port to the LM output port; and
   an output module (OM) configured to be detachably coupled to the connection plane, the OM comprising an OM input port configured to receive the LM output signal, an output control circuit, and a switch circuit, the output control circuit configured to:
      receive an input circuit signal based on the LM output signal;
      generate an OM drive signal in response to the input circuit signal; and
      send the OM drive signal to the switch circuit;
   wherein no programmable devices are in any electronic path from the OM input port to the switch circuit.

3. The control system of claim 2, wherein the IM comprises three input circuits, each input circuit configured to:
   receive an input signal from a device via the input port;
   generate an IM output signal of three IM output signals from the input signal; and
   transmit the IM output signal via one IM output port of the three IM output ports.

4. The control system of claim 3, wherein the IM further comprises an IM Built-in Test (BIT) circuit, the IM BIT circuit configured to:
   receive the three IM output signals;
   determine that one of the three IM output signals contains faulty data; and
   send a signal based on determining that the one of the three IM output signals contains faulty data.

5. The control system of claim 3, wherein the LM comprises three logic circuits, each logic circuit configured to:
   receive an input logic circuit signal based on one or more IM output signals of the three IM output signals;
   generate an LM output signal of three LM output signals in response to the input logic circuit signal; and
   transmit the LM output signal via one LM output port of the three LM output ports.

6. The control system of claim 5, wherein the OM comprises three output control circuits, each output control circuit configured to:
   receive an input circuit signal based on one or more LM output signals of the three LM output signals;
   generate an OM drive signal of three OM drive signals in response to the input circuit signal; and
   send the OM drive signal to the switch circuit.

7. The control system of claim 6, wherein the OM further comprises a first OM Built-in-Test (BIT) circuit, the first OM BIT circuit configured to:
   receive the three LM output signals;
   determine that one of the three LM output signals contains faulty data; and
   send a signal based on determining that the one of the three LM output signals contains faulty data.

8. The control system of claim 7, wherein the OM further comprises a second OM BIT circuit, the second OM BIT circuit configured to:
   receive the three OM drive signals;

determine that one of the three OM drive signals contains faulty data; and
send a signal based on determining that the one of the three OM drive signals contains faulty data.

9. A control system comprising:
a connection plane configured to receive a plurality of logic modules, a plurality of input modules, and a plurality of output modules;
an input module (IM) configured to be detachably coupled to the connection plane, the IM comprising:
an IM input port;
three IM output ports; and
three input circuits, each input circuit configured to:
receive an input signal from a device via the IM input port;
generate an IM output signal of three IM output signals from the input signal; and
transmit the IM output signal via one IM output port of the three IM output ports;
a logic module (LM) configured to be detachably coupled to the connection plane, the LM comprising:
three LM input ports, each LM input port configured to receive one IM output signal of the three IM output signals;
three LM output ports; and
three logic circuits, each logic circuit configured to:
receive an input logic circuit signal based on one or more IM output signals of the three IM output signals;
generate an LM output signal of three LM output signals in response to the input logic circuit signal;
transmit the LM output signal via one LM output port of the three LM output ports; and
an output module (OM) configured to be detachably coupled to the connection plane, the OM comprising:
three OM input ports, each OM input port configured to receive one LM output signal of the three LM output signals
a switch circuit; and
three output control circuits, each output control circuit configured to:
receive an input circuit signal based on one or more LM output signals of the three LM output signals;
generate an OM drive signal of three OM drive signals in response to the input circuit signal; and
send the OM drive signal to the switch circuit.

10. The control system of claim 9 wherein:
no programmable devices are in any electronic path from the IM input port to the three IM output ports;
no programmable devices are in any electronic path from the three LM input ports to the three LM output ports; and
no programmable devices are in any electronic path from the three OM input ports to the switch circuit.

11. A control system comprising:
a connection plane configured to receive a plurality of logic modules, a plurality of input modules, and a plurality of output modules;
an input module (IM) configured to be detachably coupled to the connection plane, the IM comprising:
an IM input port;
three IM output ports; and
three input circuits, each input circuit configured to:
receive an input signal from a device via the IM input port;
generate an IM output signal of three IM output signals from the input signal; and
transmit the IM output signal via one IM output port of the three IM output ports;
wherein no programmable devices are in any electronic path from the IM input port to any IM output port of the three IM output ports;
a logic module (LM) configured to be detachably coupled to the connection plane, the LM comprising:
three LM input ports, each LM input port configured to receive one IM output signal of the three IM output signals;
three LM output ports; and
three logic circuits, each logic circuit configured to:
receive an input logic circuit signal based one or more IM output signals of the three IM output signals;
generate an LM output signal of three LM output signals in response to the input logic circuit signal; and
transmit the LM output signal via one LM output port of the three LM output ports;
wherein no programmable devices are in any electronic path from any LM input port of the three LM input ports to any LM output port of the three LM output ports; and
an output module (OM) configured to be detachably coupled to the connection plane, the OM comprising:
three OM input ports, each OM input port configured to receive one LM output signal of the three LM output signals;
a switch circuit; and
three output control circuits, each output control circuit configured to:
receive an input circuit signal based on one or more LM output signals of the three LM output signals;
generate an OM drive signal of three OM drive signals in response to the input circuit signal; and
send the OM drive signal to the switch circuit;
wherein no programmable devices are in any electronic path from any OM input port of the three OM input ports to the switch circuit.

12. The control system of claim 11, wherein the three IM output signals comprise digital output signals;
the LM further comprising:
three LM mask faults circuits, each LM mask faults circuit associated with one of the three logic circuits;
each LM mask faults circuit configured to:
receive each of the three IM output signals; and
generate the input logic circuit signal based on a majority of the three IM output signals.

13. The control system of claim 12, wherein the three LM output signals comprise digital output signals;
the OM further comprising:
three OM mask faults circuits, each OM mask faults circuit associated with one of the three output control circuits;
each OM mask faults circuit configured to:
receive each of the three LM output signals; and
generate the input circuit signal based on a majority of the three LM output signals.

14. The control system of claim 11, wherein the LM further comprises a first LM Built-in Test (BIT) circuit, the first LM BIT circuit configured to:
receive the three IM output signals;
determine that one of the three IM output signals contains faulty data; and
send a signal based on determining that the one of the three IM output signals contains faulty data.

15. The control system of claim 14, wherein the LM further comprises a light, and wherein sending the signal based on determining that the one of the three IM output signals contains faulty data comprises sending the signal to alter a state of the light.

16. The control system of claim 14, wherein the LM further comprises a BIT consolidation circuit, and wherein sending the signal based on determining that the one of the three IM output signals contains faulty data comprises sending the signal to the BIT consolidation circuit, and wherein the BIT consolidation circuit is configured to send an alert identifying the LM as a faulty module.

17. The control system of claim 14, wherein the LM further comprises a second LM BIT circuit, the second LM BIT circuit configured to:
   receive the three LM output signals;
   determine that one of the three LM output signals contains faulty data; and
   send a signal based on determining that one of the three LM output signals contains faulty data.

18. The control system of claim 17, wherein the OM further comprises a first OM BIT circuit, the first OM BIT circuit configured to:
   receive the three LM output signals;
   determine that one of the three LM output signals contains faulty data; and
   send a signal based on determining that the one of the three LM output signals contains faulty data.

19. The control system of claim 18, wherein the OM further comprises a second OM BIT circuit, the second OM BIT circuit configured to:
   receive the three OM drive signals;
   determine that one of the three OM drive signals contains faulty data; and
   send a signal based on determining that the one of the three OM drive signals contains faulty data.

* * * * *